(12) United States Patent
Kim et al.

(10) Patent No.: US 8,748,065 B2
(45) Date of Patent: Jun. 10, 2014

(54) REFLECTION TYPE BLANK MASKS, METHODS OF FABRICATING THE SAME, AND METHODS OF FABRICATING REFLECTION TYPE PHOTO MASKS USING THE SAME

(75) Inventors: Yong Dae Kim, Cheonan-si (KR); Byung Ho Nam, Daegu (KR)

(73) Assignee: SK Hynix Inc., Gyeonggi-do (KR)

( * ) Notice: Subject to any disclaimer, the term of this patent is extended or adjusted under 35 U.S.C. 154(b) by 72 days.

(21) Appl. No.: 13/614,373

(22) Filed: Sep. 13, 2012

(65) Prior Publication Data
US 2013/0323629 A1    Dec. 5, 2013

(30) Foreign Application Priority Data

Jun. 5, 2012    (KR) .................. 10-2012-0060242

(51) Int. Cl.
*G03F 1/42* (2012.01)
*G03F 1/24* (2012.01)

(52) U.S. Cl.
USPC .................................................. 430/5; 430/22

(58) Field of Classification Search
CPC ..................................... G03F 1/24; G03F 1/42
USPC ....................................................... 430/5, 22
See application file for complete search history.

(56) References Cited

U.S. PATENT DOCUMENTS 7,078,136 B2 * 7/2006 Yan ................................. 430/5

\* cited by examiner

*Primary Examiner* — Stephen Rosasco
(74) *Attorney, Agent, or Firm* — William Park & Associates Patent Ltd.

(57) ABSTRACT

Reflection type blank masks are provided. The blank mask includes a substrate, a reflection layer substantially on the substrate, at least one fiducial mark substantially on the reflection layer, an absorption layer substantially on the at least one fiducial mark and the reflection layer, and a resist layer substantially on the absorption layer.

20 Claims, 3 Drawing Sheets

REFLECTION TYPE BLANK MASKS, METHODS OF FABRICATING THE SAME, AND METHODS OF FABRICATING REFLECTION TYPE PHOTO MASKS USING THE SAME

CROSS-REFERENCES TO RELATED APPLICATIONS

The present application claims priority under 35 U.S.C 119(a) to Korean Application No. 10-2012-0060242, filed on Jun. 5, 2012, in the Korean intellectual property Office, which is incorporated herein by reference in its entirety.

BACKGROUND

1. Technical Field

Various embodiments of the present disclosure generally relate to photo masks used in fabrication of semiconductor devices, and to reflection type blank masks, methods of fabricating the same, and methods of fabricating reflection type photo masks using the same.

2. Related Art

As semiconductor devices become more highly integrated, sizes of circuit patterns constituting the semiconductor devices have been continuously reduced. Thus, there may be some limitations in realizing the fine patterns with a photolithography process utilizing ultraviolet (UV) rays. Accordingly, an extreme ultraviolet (EUV) lithography process has been proposed to form the fine patterns of the semiconductor devices. The EUV rays may have relatively short wavelengths. For example, the EUV rays may have a wave length of about 0.2 nanometers to about 100 nanometers.

A reflection type mask may be used in the EUV lithography process. The reflection type mask may include a laminated reflection layer formed on a transparent substrate and absorption layer patterns (e.g., metal patterns) formed on the laminated reflection layer. The laminated reflection layer exposed by absorption layer patterns may reflects the EUV rays and the absorption layer patterns may absorbs the EUV rays. Planar images of the absorption layer patterns (or planar images of the exposed portions of the reflection layer) may be transferred on a wafer using a EUV lithography apparatus (e.g., an exposure apparatus) with the reflection type mask. During the EUV lithography process, the EUV rays may be irradiated on the reflection type mask. The absorption layer patterns may absorb the EUV rays while the EUV lithography process is performed. In contrast, the EUV rays irradiated onto the exposed portions of the laminated reflection layer may be reflected toward a resist layer coated on the wafer through a mirror optical system.

There are many issues in the development of the EUV lithography process. For example, the EUV lithography process may be affected by substrate defects of the reflection type masks used in the EUV lithography process. In particular, it may be difficult to fabricate blank masks without any defects because the laminated reflection layer of the EUV mask is formed by stacking a plurality of layers, for example, about eighty layers of molybdenum/silicon. In order to minimize the influence of the substrate defects (e.g., blank defects) on the lithography process, the coordinates and sizes of the blank defects should be accurately recognized.

Fiducial marks may be formed in the transparent substrate to increase the accuracy of the substrate defect inspection, and the fiducial marks may be used as reference position marks during inspection of the substrate defects. The fiducial marks may be formed by etching the mask substrate before the laminated reflection layer is formed. Thus, the fiducial marks may be formed to have a recessed shape. Meanwhile, the fiducial marks may be formed by coating a resist layer on the mask substrate, exposing the resist layer, developing the exposed resist layer, etching the mask substrate using the developed resist layer as an etch mask, removing the developed resist layer, and cleaning the etched mask substrate. Accordingly, additional substrate defects may be formed while the fiducial marks are formed. These substrate defects may be transferred on the wafer even through laminated reflection layer is formed on the mask substrate having the substrate defects. That is, the substrate defects may degrade the quality of the reflection type masks.

SUMMARY

Various embodiments are directed to reflection type blank masks, methods of fabricating the same, and methods of fabricating reflection type photo masks using the same.

According to various embodiments, a reflection type blank mask includes a substrate, a reflection layer substantially on the substrate, at least one fiducial mark substantially on the reflection layer, an absorption layer substantially on the at least one fiducial mark and the reflection layer, and a resist layer substantially on the absorption layer.

According to various embodiments, a method of fabricating a reflection type blank mask includes forming a laminated reflection layer substantially on a mask substrate, forming at least one fiducial mark substantially on the laminated reflection layer, and forming an absorption layer substantially on the at least one fiducial mark and the laminated reflection layer.

According to various embodiments, a method of fabricating a reflection type photo mask includes forming a laminated reflection layer substantially on a mask substrate, forming at least one fiducial mark on the laminated reflection layer, inspecting defects of the laminated reflection layer to extract defect data, and forming absorption layer patterns substantially on the laminated reflection layer after inspection of the laminated reflection layer. The absorption layer patterns define circuit patterns which are formed on a wafer. The absorption layer patterns are formed using the defect data such that the number of defects overlapped with the circuit patterns is minimized.

BRIEF DESCRIPTION OF THE DRAWINGS

The above and other features and advantages of the disclosure will become more apparent in view of the attached drawings and accompanying detailed description.

DETAILED DESCRIPTION

Figure 1:
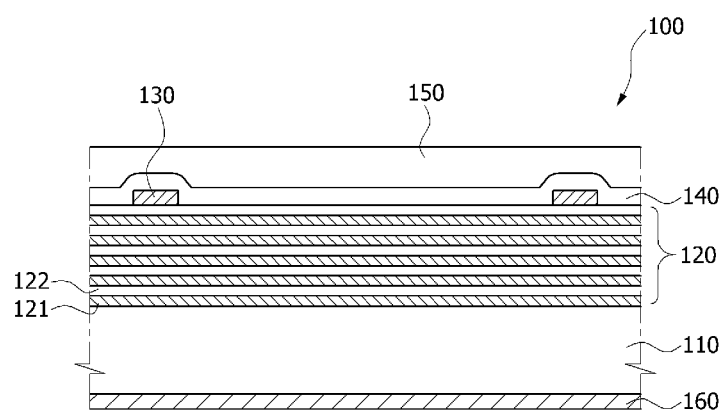
FIG. 1 is a cross sectional view illustrating an example of a reflection type blank mask according to an embodiment.

Various embodiments will be described more fully hereinafter with reference to the accompanying drawings. In explanations of the various embodiments, the same or corresponding elements may be denoted by the same reference numerals or the same reference designators. To avoid duplicate explanation, descriptions to the same elements as set forth in the previous embodiment may be omitted or briefly mentioned in each embodiment.

The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Meanwhile, it may be understood that when one element, such as a layer, is referred to as being 'on (or over)' the other element (for example, a semiconductor substrate), it may directly come in contact with the other element, or a third element or elements may be interposed between the two elements etc. Furthermore, in the drawings, the size and thickness of each layer is enlarged, for ease of description and clarity, and the same reference numerals designate the same elements throughout the drawings. In this specification, specific terms have been used. The terms are used to describe the present invention, and are not used to qualify the sense or limit the scope of the present invention.

In this specification, 'and/or' represents that one or more of components arranged before and after 'and/or' is included. Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added FIG. 1 is a cross sectional view illustrating an example of a reflection type blank mask according to an embodiment.

Referring to FIG. 1, a reflection type blank mask 100 may include a substrate 110, and a laminated reflection layer 120 disposed substantially on the substrate 110 to reflect extreme ultraviolet (EUV) rays. Additionally, fiducial marks 130 may be disposed substantially on portions of the laminated reflection layer 120, and an absorption layer 140 may be disposed substantially on the fiducial marks 130. The laminated reflection layer 120 may absorb the EUV rays, and a resist layer 150 may be formed substantially on the absorption layer 140. A buffer layer may be additionally disposed substantially between the laminated reflection layer 120 and the absorption layer 140 and substantially between the laminated reflection layer 120 and the fiducial marks 130. In various embodiments, a capping layer may be disposed instead of the buffer layer. In other embodiments, the capping layer may be disposed substantially between the buffer layer and the laminated reflection layer 120.

The substrate 110 may include a material having a relatively low coefficient of thermal expansion. For example, the substrate 110 may be a glass substrate.

The laminated reflection layer 120 may include a plurality of thin films constituting a Bragg reflector to improve its reflectivity to the EUV rays used in a EUV lithography apparatus. In an embodiment, the laminated reflection layer 120 may include a plurality of high refractive material layers and a plurality of low refractive material layers which are alternately stacked. For example, the laminated reflection layer 120 may include a plurality of molybdenum (Mo) layers and a plurality of silicon (Si) layers which are alternately stacked. That is, the laminated reflection layer 120 may include the plurality of molybdenum (Mo) layers and the plurality of silicon (Si) layers disposed substantially between the plurality of molybdenum (Mo) layers. The molybdenum (Mo) layers may have a relatively high refractive index and the silicon (Si) layers may have a relatively low refractive index. Alternatively, the laminated reflection layer 120 may be formed by repeatedly stacking a bi-layer of a molybdenum (Mo) layer and a beryllium (Be) layer, a bi-layer of a ruthenium (Ru) layer and a silicon (Si) layer, a bi-layer of a silicon (Si) layer and a niobium (Nb) layer, a bi-layer of a molybdenum carbide (MoC) layer and a silicon (Si) layer, a bi-layer of a molybdenum compound layer and a silicon compound layer, or a triple-layer of a molybdenum (Mo) layer, a molybdenum carbide (MoC) layer and a silicon (Si) layer.

The stack number of the bi-layer or the triple-layer constituting the laminated reflection layer 120 may be equal to or greater than '30' to obtain a reflectivity of about 50% or greater. Alternatively, the stack number of the bi-layer or the triple-layer constituting the laminated reflection layer 120 may be equal to or greater than '35' to obtain a reflectivity of about 60% or greater. For example, the stack number of the bi-layer or the triple-layer constituting the laminated reflection layer 120 may be within the range of about 40 to about 60 to obtain a reflectivity of about 60% or greater. Further, the laminated reflection layer 120 may have a total thickness of about 210 nanometers to about 300 nanometers, but not limited thereto. For example, the total thickness of the laminated reflection layer 120 may be determined in consideration of a wavelength of the EUV rays used in the EUV lithography process.

The fiducial marks 130 may be used as reference marks during inspection and/or registration of defects of the blank mask 100. Thus, the fiducial marks 130 may be substantially disposed in an edge of the blank mask, which may not be transferred onto a chip region of a wafer. The fiducial marks 130 may have a convex shape in the reflection type blank mask 100, as illustrated in FIG. 1. That is, the fiducial marks 130 may be formed by depositing a fiducial mark layer substantially on the laminated reflection layer 120 and by patterning the fiducial mark layer. Thus, the fiducial mark layer may be formed of a material having an etch selectivity with respect to the laminated reflection layer 120. In various embodiments, the fiducial marks 130 may include a chrome containing layer or a tantalum containing layer. For example, the fiducial marks 130 may include a chrome nitride (CrN) layer or a tantalum nitride (TaN) layer and may have a thickness of about 20 micrometers to about 100 micrometers.

The absorption layer 140 may include a material that absorbs the EUV rays. In various embodiments, the absorption layer 140 may include a compound layer containing tantalum (Ta), for example, a tantalum nitride (TaN) layer. The material containing tantalum (Ta) may be more readily etched using a plasma etch process that employs radicals of a fluorine system as etching chemical sources, and the radicals of a fluorine system may be widely used in fabrication of semiconductor devices. Thus, the tantalum nitride (TaN) layer may be suitable for the absorption layer 140. However, the absorption layer 140 may not be limited to the tantalum nitride (TaN) layer. For example, the absorption layer 140 may be formed of any material having an absorptivity to the EUV rays.

The buffer layer or the capping layer may be used as an etch stop layer in a subsequent etching process for patterning the absorption layer 140. In various embodiments, the buffer layer and/or the capping layer may include a silicon nitride (SiN) layer, a silicon oxynitride (SiON) layer or the like. In various embodiments, the absorption layer 140 may be directly formed substantially on the fiducial marks 130 and the laminated reflection layer 120 without formation of the buffer layer or the capping layer.

The blank mask 100 may further include a conductive layer 160 disposed substantially on a bottom surface of the substrate 110 substantially opposite to the laminated reflection layer 120. The conductive layer 160 may cause an electrostatic chucking effect when a photo mask formed using the blank mask 100 is loaded into a lithography apparatus. In various embodiments, the conductive layer 160 may include a chrome (Cr) layer or a chrome nitride (CrN) layer.

According to the reflection type blank mask described above, the fiducial marks 130 having a convex or protruding shape may be disposed substantially on the laminated reflection layer 120. That is, the fiducial marks 130 may be formed even without etching the substrate 110. Thus, it can substantially prevent the substrate 110 from being contaminated and/or damaged during formation of the fiducial marks 130. Also, it may suppress or minimize the substrate defects. In addition, even though some residues of the fiducial mark layer may remain on the laminated reflection layer 120 after formation of the fiducial marks 130, the residues may be more readily removed during an etching process for patterning the absorption layer 140. This is because the main etching gas used in formation of the fiducial marks 130 may be the same as or similar to that used in the etching process for patterning the absorption layer 140. Moreover, in the event that the conventional fiducial marks are formed by etching the substrate 110, the conventional fiducial marks may be substantially covered with the laminated reflection layer 120. Thus, it may be difficult to repair the conventional fiducial marks. In contrast, the fiducial marks 130 according to the various embodiments may be formed substantially on a top surface of the laminated reflection layer 120. Thus, it may be easy to repair the fiducial marks 130 using a redundancy apparatus.

Now, methods of fabricating a reflection type blank mask according to various embodiments will be described in detail hereinafter.

Figure 2:
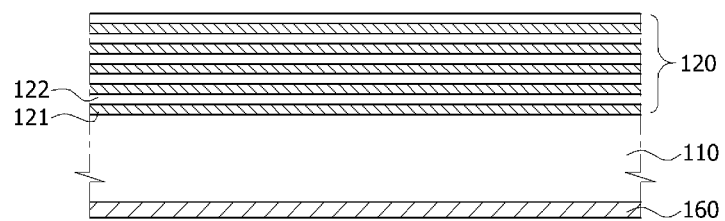
FIGS. 2 to 4 are cross sectional views illustrating an example of a method of fabricating a reflection type blank mask according to an embodiment.
Figure 3:
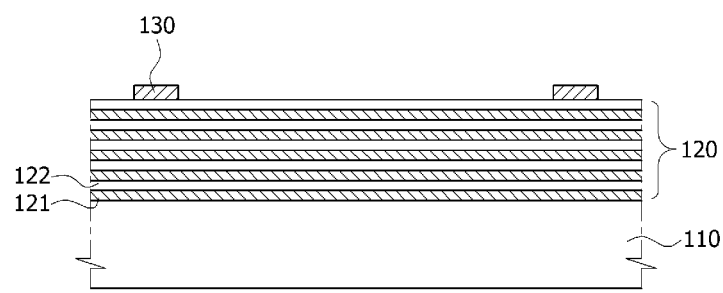
Figure 4:
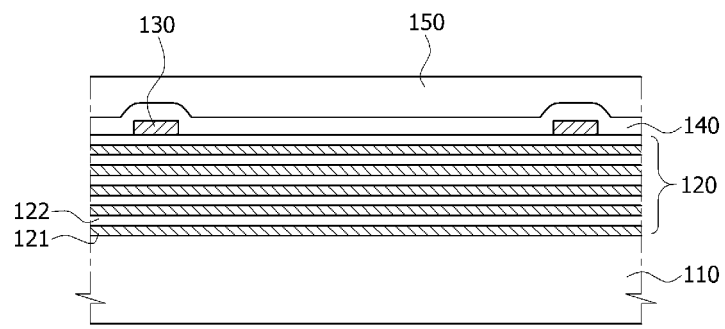

FIGS. 2 to 4 are cross sectional views illustrating an example of a method of fabricating a reflection type blank mask according to an embodiment. In the drawings of FIGS. 2 to 4, the elements indicated by the same reference numerals or the same reference designators as used in FIG. 1 denote the same elements.

Referring to FIG. 2, a substrate 110 may be provided. The substrate 110 may include a material having a relatively low coefficient of thermal expansion. For example, the substrate 110 may be a glass or quartz substrate. A molybdenum (Mo) 121 layer and a silicon (Si) layer 122 may be alternately and repeatedly stacked substantially on the substrate 110, thereby forming a laminated reflection layer 120. The laminated reflection layer 120 may be formed by alternately and repeatedly stacking the molybdenum (Mo) layer 121 and the silicon (Si) layer 122 substantially on the substrate 110 about forty times to about sixty times using a sputtering process. That is, the molybdenum (Mo) layer 121 and the silicon (Si) layer 122 may be alternately formed using a sputtering apparatus in which a molybdenum (Mo) target and a silicon (Si) target are mounted and introducing an argon gas into the sputtering apparatus. While the molybdenum (Mo) layer 121 is formed, the silicon (Si) target may be substantially covered with a shutter to substantially prevent the silicon layer 122 from being formed. Similarly, while the silicon (Si) layer 122 is formed, the molybdenum (Mo) target may be substantially covered with the shutter to substantially prevent the molybdenum (Mo) layer 121 from being formed. Although not shown in the drawings, a single layer of a capping layer or a double layer of a capping layer and a buffer layer may be formed substantially on the laminated reflection layer 120.

As described above, the laminated reflection layer 120 may be formed by alternately stacking a plurality of molybdenum (Mo) layers 121 and a plurality of silicon (Si) layers 122. This may be for increasing the reflectivity of the laminated reflection layer 120 to extreme ultraviolet (EUV) rays used in a lithography process. Accordingly, while the laminated reflection layer 120 is formed, contaminants and/or defects may be formed in the laminated reflection layer 120. If the defects and/or the contaminants are located in reflection regions of the laminated reflection layer 120, images of the defects may be transferred on a wafer in a subsequent exposure step and may cause the malfunction of a semiconductor device. Thus, coordinates of the defects and/or the contaminants should be inspected and detected to find out coordinates or positions of the defects and/or the contaminants, and the coordinates of the defects and/or the contaminants should be stored in a memory unit to draw an effective layout in a subsequent chip design step. In order to find out the coordinates of the defects and/or the contaminants, a reference mark may be required.

Referring to FIG. 3, a fiducial mark layer may be formed substantially on the laminated reflection layer 120. The fiducial mark layer may be formed of a material having an etch selectivity with respect to the laminated reflection layer 120. For example, the fiducial mark layer may be formed of a chrome nitride (CrN) layer or a tantalum nitride (TaN) layer. The fiducial mark layer may be formed to have a thickness of about 20 micrometers to about 100 micrometers. A resist layer may be formed substantially on the fiducial mark layer, and the resist layer may be patterned to form a resist pattern. Subsequently, the fiducial mark layer may be etched using the resist pattern as an etch mask, thereby forming fiducial marks 130 substantially having a protruding or convex shape. An etching process for forming the fiducial marks 130 may be performed using a dry etching technique that utilizes a chlorine based gas as an etch gas. The resist pattern may then be removed.

Referring to FIG. 4, after formation of the fiducial marks 130, an inspection process may be performed to determine whether defects and/or contaminants exist on the substrate 110.

The inspection process may include aligning the substrate having the fiducial marks 130 with an optical system, finding out defects formed on and in the laminated reflection layer 120 using the optical system, and storing coordinates of the defects in a memory unit. The coordinates of the defects may be calculated using the fiducial marks 130 as reference marks. The step of finding out the defects may include irradiating physical signals (e.g., optical rays) outputted from the optical system onto the substrate having the fiducial marks 130 and analyzing rays emitted or reflected from a surface of the substrate having the fiducial marks 130. If the optical rays of the optical system are irradiated onto the defects, the defects may scatter the optical rays to form dark fields at the corresponding positions of the defects. Accordingly, the locations of the dark fields may be regarded as the coordinates of the defects.

After finding out and storing the coordinates of the defects, an absorption layer 140 may be formed substantially on the fiducial marks 130 and the laminated reflection layer 120. The absorption layer 140 may be substantially formed of a material that absorbs the EUV rays. In various embodiments, the absorption layer 140 may be substantially formed of a conductive absorption layer containing tantalum. For example, the absorption layer 140 may be substantially formed of a tantalum nitride (TaN) layer. The material containing tantalum (Ta) may be more readily etched using a plasma etch process that employs radicals of a fluorine system as etching chemical sources, and the radicals of a fluorine system may be widely used in fabrication of semiconductor devices. Thus, the tantalum nitride (TaN) layer may be suitable for the absorption layer 140. However, the absorption layer 140 may not be limited to the tantalum nitride (TaN) layer. For example, the absorption layer 140 may be formed of any material having an absorptivity to the EUV rays. In various embodiments, the absorption layer 140 may be formed by introducing an argon gas into an ion beam generation apparatus and by depositing a copper (Cu) layer, an aluminum (Al) layer, a titanium (Ti) layer or a tantalum (Ta) layer with a nitrogen (N) gas or a helium (He) gas.

Finally, a resist layer 150 may be coated or formed substantially on the absorption layer 140 to complete the reflection type blank mask 100 illustrated in FIG. 1.

Methods of fabricating a reflection type photo mask using the reflection type blank mask described above will be described hereinafter.

Figure 5:
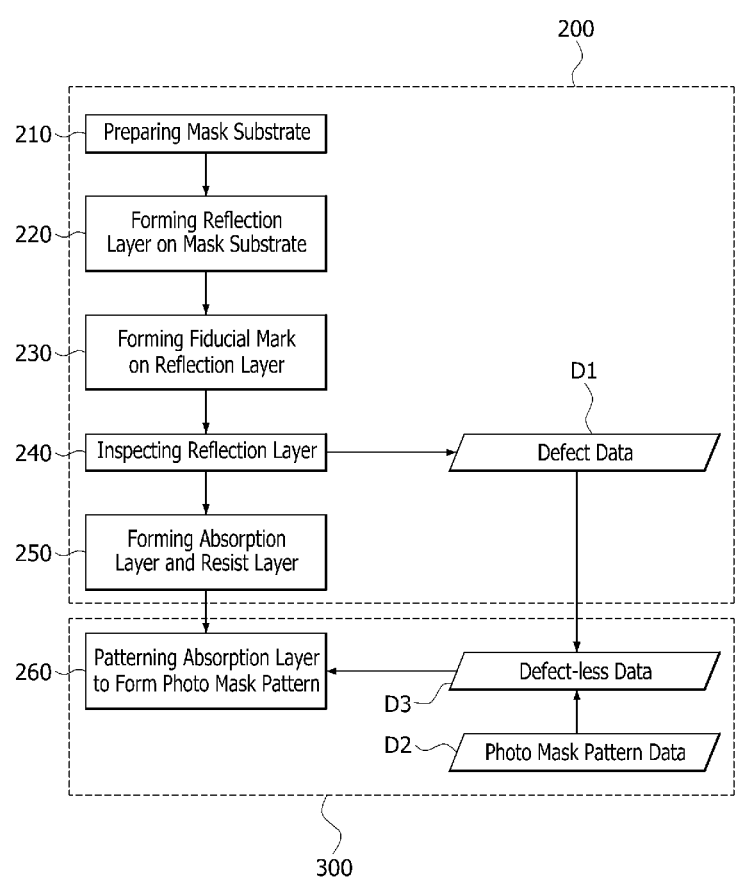
FIG. 5 is a process flowchart illustrating an example of a method of fabricating a reflection type photo mask according to an embodiment.

FIG. 5 is a process flowchart illustrating an example of a method of fabricating a reflection type photo mask according to an embodiment.

Referring to FIGS. 1 and 5, a fabrication method of a reflection type photo mask may include providing a blank mask (step 200 of FIG. 5) and forming patterns on the blank mask (step 300 of FIG. 5).

Providing the blank mask (step 200) may include preparing a mask substrate (step 210), forming a reflection layer substantially on the mask substrate (step 220), forming fiducial marks substantially on the reflection layer (step 230), inspecting the reflection layer (step 240), and forming an absorption layer and a resist layer substantially on the fiducial marks and the reflection layer (step 250). Prior to formation of the fiducial marks (130 of FIG. 4), a single layer of a capping layer or a double layer of a capping layer and a buffer layer may be formed substantially on the reflection layer (120 of FIG. 4). After formation of the fiducial marks 130, an inspection process may be performed to find out whether the mask substrate (110 of FIG. 4) and the reflection layer 120 include defects or not. In the event that defects are detected in the mask substrate 110 and/or the reflection layer 120, coordinates and sizes of the defects may be calculated or measured and defect data D1 including the coordinates and sizes of the defects may be stored in a memory unit. The fiducial marks 130 may be used as reference marks or reference positions (hereinafter, referred to as reference points) during the inspection process.

Forming the patterns on the blank mask 300 may include patterning the absorption layer 140 using defect-less data D3 (step 260 of FIG. 5) after generation of the defect-less data D3. The absorption layer 140 may be patterned to form absorption layer patterns exposing portions of the reflection layer 120. If the defects (in particular, defects having large sizes) are located in the exposed portions of the reflection layer 120, images of the defects may be transferred onto a wafer in a subsequent exposure step. Thus, the defect-less data D3 may be generated to minimize the number of the defects (particularly, large-sized defects) which are transferred onto the wafer in a subsequent exposure step. That is, the defect-less data D3 may minimize the number and size of the defects which are located in the exposed portions of the reflection layer 120. The defect-less data D3 may be generated using photo mask pattern data D2 corresponding to circuit patterns and the defect data D1 generated in providing the blank mask (step 200).

More specifically, the photo mask pattern data D2 may include information on the circuit patterns which may be transferred on the wafer, for example, information on positions where the circuit patterns are formed. Accordingly, the photo mask pattern data D2 may include information on the coordinates of the circuit patterns, which may be calculated using a predetermined reference point (e.g., a circuit reference point). The defect data D1 may include information on the coordinates of the defects, which may be calculated using the fiducial marks 130 as reference points. The defect-less data D3 may include information on how the coordinates of the defects correspond to the coordinates of the circuit patterns. That is, the defect-less data D3 may minimize the probability that the defects overlap with the circuit patterns. As a result, optimum layouts having minimum defects can be obtained.

As described above, it may be difficult to form defect-less layers on the mask substrate or to completely remove the defects. Thus, it may be important to reduce or minimize the number and the size of the defects overlapped with the circuit patterns in order to obtain high quality photo masks. According to the various embodiments, the number and the size of the defects overlapped with the circuit patterns can be reduced or minimized using defect-less data obtained by the inspection process. Thus, the throughput and the yield of the photo masks can be improved to reduce the fabrication cost of the photo masks.

According to the embodiments set forth above, fiducial marks may be formed substantially on a laminated reflection layer without etching a mask substrate. Thus, it can prevent defects or contaminants from being formed in the mask substrate during formation of the fiducial marks. Moreover, even though defects are formed substantially on the laminated reflection layer during formation of the fiducial marks, the defects on the laminated reflection layer may be more readily removed in a subsequent etching process for forming absorption layer patterns.

Further, the fiducial marks according to the various embodiments may be formed substantially on a top surface of the laminated reflection layer. Thus, it can be easy to repair the fiducial marks using a redundancy apparatus.

The various embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A reflection type blank mask, the blank mask comprising:
   a substrate;
   a reflection layer substantially on the substrate;
   at least one fiducial mark substantially on the reflection layer;
   an absorption layer substantially on the at least one fiducial mark and the reflection layer; and
   a resist layer substantially on the absorption layer.

2. The blank mask of claim 1, wherein the reflection layer includes a plurality of high refractive material layers and a plurality of low refractive material layers which are alternately stacked.

3. The blank mask of claim 1, wherein the at least one fiducial mark includes a chrome containing layer or a tantalum containing layer.

4. The blank mask of claim 3, wherein the at least one fiducial mark includes a chrome nitride (CrN) layer or a tantalum nitride (TaN) layer.

5. The blank mask of claim 1, wherein the at least one fiducial mark has a thickness of about 20 micrometers to about 100 micrometers.

6. The blank mask of claim 1, further comprising a capping layer disposed substantially on the reflection layer.

7. The blank mask of claim 1, further comprising a conductive layer substantially on a backside surface of the substrate substantially opposite to the reflection layer.

8. The blank mask of claim 1, wherein the at least one fiducial mark functions as a reference mark when coordinates of defects in and on the reflection layer are calculated.

9. A method of fabricating a reflection type blank mask, the method comprising:
   forming a laminated reflection layer substantially on a mask substrate;
   forming at least one fiducial mark substantially on the laminated reflection layer; and
   forming an absorption layer substantially on the at least one fiducial mark and the laminated reflection layer.

10. The method of claim 9, wherein forming the laminated reflection layer includes alternately and repeatedly stacking a high refractive material layer and a low refractive material layer.

11. The method of claim 9, wherein forming the at least one fiducial mark includes:
   forming a fiducial mark layer substantially on the laminated reflection layer; and
   patterning the fiducial mark layer to form the at least one fiducial mark substantially having a convex or protruding shape.

12. The method of claim 9, wherein the at least one fiducial mark is formed of a chrome containing layer or a tantalum containing layer.

13. The method of claim 12, wherein the at least one fiducial mark is formed of a chrome nitride (CrN) layer or a tantalum nitride (TaN) layer.

14. The method of claim 9, wherein the at least one fiducial mark is formed to have a thickness of about 20 micrometers to about 100 micrometers.

15. The method of claim 11, wherein the fiducial mark layer is patterned using a chlorine based gas.

16. The method of claim 9, further comprising inspecting defects in and on the laminated reflection layer prior to formation of the absorption layer and after formation of the at least one fiducial marks.

17. A method of fabricating a reflection type photo mask, the method comprising:
   forming a laminated reflection layer substantially on a mask substrate;
   forming at least one fiducial mark on the laminated reflection layer;
   inspecting defects of the laminated reflection layer to extract defect data; and
   forming absorption layer patterns substantially on the laminated reflection layer after inspection of the laminated reflection layer,
   wherein the absorption layer patterns define circuit patterns which are formed on a wafer, and
   wherein the absorption layer patterns are formed using the defect data such that the number of defects overlapped with the circuit patterns is minimized.

18. The method of claim 17, wherein forming the at least one fiducial mark includes:
   forming a fiducial mark layer substantially on the laminated reflection layer; and
   patterning the fiducial mark layer to form the at least one fiducial mark substantially having a convex or protruding shape.

19. The method of claim 17, further comprising generating photo mask pattern data including information on positions where the circuit patterns are formed,
   wherein forming the absorption layer patterns includes:
   forming an absorption layer substantially on the laminated reflection layer;
   generating optimum layouts such that the number of the defects overlapped with the circuit patterns is minimized, using the photo mask pattern data and the defect data; and
   transferring images of the optimum layouts to the absorption layer.

20. The method of claim 19, wherein positions of the optimum layouts are defined using the fiducial mark as a reference mark.

* * * * *